United States Patent [19]

Davis

[11] Patent Number: 4,672,576
[45] Date of Patent: Jun. 9, 1987

[54] PROGRAMMABLE READ ONLY MEMORY OUTPUT CIRCUIT

[75] Inventor: Walter L. Davis, Coral Springs, Fla.

[73] Assignee: Motorola, Inc., Schaumburg, Ill.

[21] Appl. No.: 753,084

[22] Filed: Jul. 9, 1985

[51] Int. Cl.[4] ............... G11C 17/06; G11C 7/00
[52] U.S. Cl. ............................ 365/105; 365/96; 365/189; 365/207; 323/271; 323/315; 307/299 B
[58] Field of Search ............... 365/189, 94, 96, 103, 365/104, 105, 175, 205, 207, 208, 230, 242; 307/299 B, 297, 530; 323/268, 270, 271, 311, 312, 315

[56] References Cited

U.S. PATENT DOCUMENTS

| | | | |
|---|---|---|---|
| 4,101,974 | 7/1978 | Immer et al. | 365/96 |
| 4,130,889 | 12/1978 | Chua | 365/96 |
| 4,152,627 | 5/1979 | Priel et al. | 365/94 |
| 4,276,617 | 6/1981 | Le | 365/189 |
| 4,385,368 | 5/1983 | Principi et al. | 365/105 |
| 4,432,070 | 2/1984 | Moss | 365/96 |
| 4,441,167 | 4/1984 | Principi | 365/94 |

FOREIGN PATENT DOCUMENTS

| | | | |
|---|---|---|---|
| 0070491 | 4/1983 | Japan | 365/189 |
| 2135550 | 8/1984 | United Kingdom | 365/103 |

Primary Examiner—James W. Moffitt
Assistant Examiner—Glenn A. Gossage
Attorney, Agent, or Firm—Martin J. McKinley; Daniel K. Nichols; Joseph T. Downey

[57] ABSTRACT

An I$^2$L programmable read only memory (PROM) output circuit has a selectable dual non-inverting input differential amplifier with each non-inverting input connected to a different column of memory elements. In the read mode the circuit operates at very low power levels and down to 1 volt. To program the memory elements, the circuit includes two selectable programming current sources which self extinguish as soon as the memory element being programmed changes from its unprogrammed to its programmed state. Switching between the read and program modes is accomplished merely by changing the voltage on the B+ terminal; 1-3 volts for read and 9-12 volts for program.

14 Claims, 8 Drawing Figures

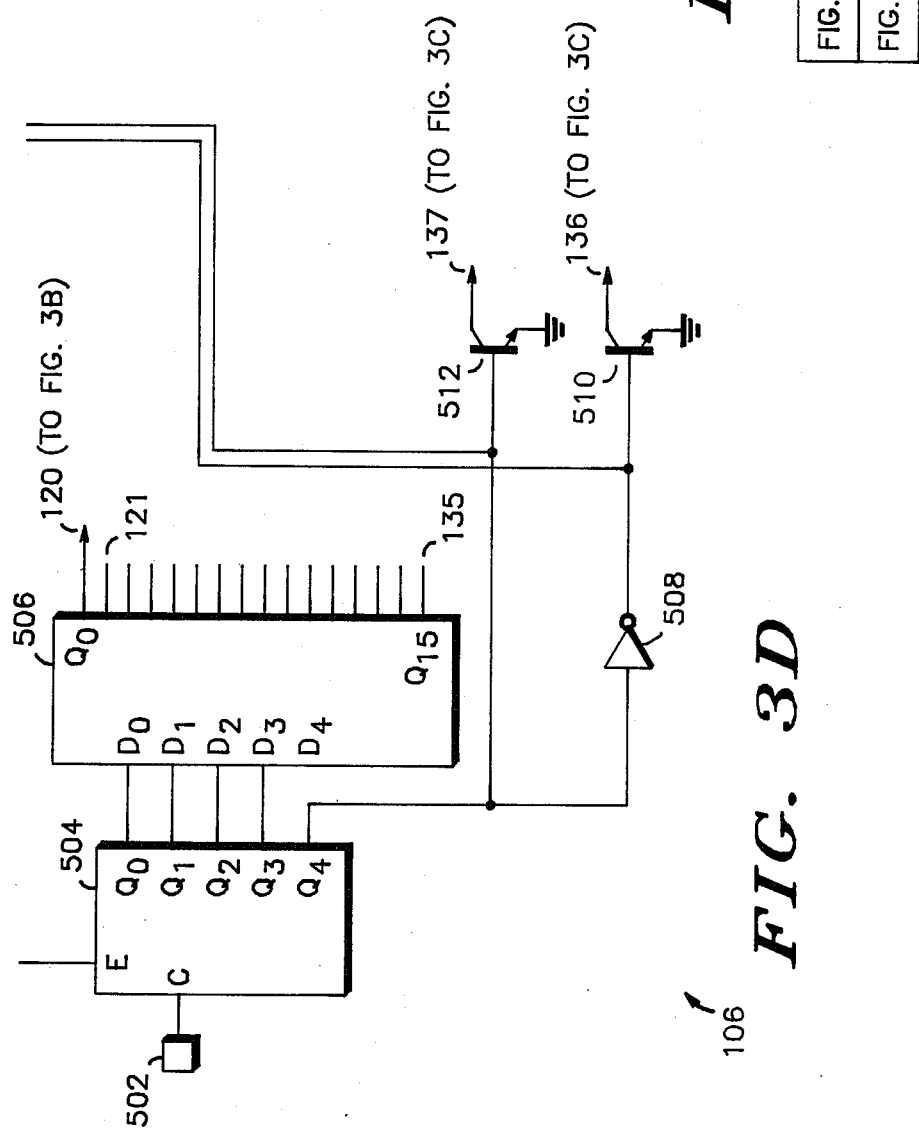

PROGRAMMABLE READ ONLY MEMORY OUTPUT CIRCUIT

BACKGROUND OF THE INVENTION

This invention relates to the field of programmable read only memories (PROM's) and more particularly to low power, low voltage PROM's that find application in battery operated personal paging receivers.

In the design of selective call personal paging receivers it is desirable to prolong the operating time between battery charges or replacement. As the physical size of paging receivers has been reduced over the years, the size and electrical capacity of their batteries have also been reduced, potentially causing a corresponding reduction in the paging receiver's operating time. To compensate for the reduced battery capacity it is desirable to develop paging receiver circuits that achieve the lowest power consumption possible. Development work has been directed towards reducing the power drain of some paging receiver circuits. This work has led to the development of both low power circuit designs and to the development of sophisticated switching methods, or "battery saver techniques", whereby portions of the paging receiver are switched ON only for brief intervals and only when they are required to be on, as determined by the selective call coding protocol.

A paging receiver is usually powered from a one cell battery having a voltage in the range of 1.1 to 1.5 volts. Ideally, the paging receiver circuits are powered directly from the battery, however, some circuits will not operate at these low voltages and it becomes necessary to add a DC-DC converter to step-up the voltage. Because DC-DC converters are less than 100% efficient and they require larger and more expensive components as their load increases, it is desirable to operate as few circuits as possible from the DC-DC converter.

Present designs of paging receivers typically contain a single chip microcomputer. These microcomputers include an internal mask programmable read only memory (ROM) wherein the majority of the microcomputer's software is stored. Since these microcomputers are produced in volume, individualized software is not possible.

The paging receiver, however, has a requirement that some of the software be individualized. One of the more important requirements is that the paging receiver have a unique address, such that a central base station can "page" one receiver while excluding all other paging receivers in the system. Because of the requirement for unique software, it becomes necessary to add a small PROM peripheral to the microcomputer wherein address and other individualized data can be stored. In this application, the PROM is referred to as a "code plug".

Presently, PROM's have been fabricated using well known integrated circuit technologies such as NMOS, CMOS, and TTL. These circuits, however, fail to meet one or both of the aforementioned goals for use in a paging receiver, more specifically, low power drain and operation down to 1.1 volts, or less.

PROM circuits may be comprised of a matrix of memory elements arranged between row and column conductors, with each memory element connecting a unique combination of one row conductor to one column conductor. The state of the memory element is determined by its conductivity, i.e. shorted or open.

To read the memory element state, a column driver attempts to source current to the column conductor and a selectively activated row driver circuits sinks this current if the memory element is shorted. If the memory element is shorted, the voltage at the column conductor is low, while if the memory element is open the voltage at the column conductor is high. An output circuit senses the low or high voltage on the column conductor and appropriately outputs a one or a zero.

Programming is accomplished by placing a large current through a selected memory element. Some memory elements, for example the well known nickel chromium link, change from the shorted state to the open state when programmed. Conversely, the Zener diode memory elements described in the preferred embodiment, change from the open state to the shorted state when programmed.

The Zener diode memory element consists of two diodes, serially connected anode to anode with the Zener diode positioned immediately above the other diode. During programming, the lower diodes conducts because it is forward biased and the Zener diode conducts because its Zener voltage has been exceeded. Because of the large programming current, a metallic deposit above the Zener diode diffuses into the Zener diode shorting out its junction. Because it is important that the deposit not diffuses into the lower diode, it is desirable that the programming current be extinguished immediately after the Zener diode shorts out.

Prior out PROM's normally require at least one additional terminal to switch the device between the read and program modes, while others require more. Because of the aforementioned reduced physical size of paging receivers, it is desirable that the PROM have a minimum number of interconnecting terminals. Additional terminals not only require larger packages to contain the PROM, such as larger chip carriers, and an increase in the complexity of the circuits interfaced to the PROM, but also require an increase in the number of interconnecting conductors. All of these factors increase space requirements. Therefore, it would be desirable to have a PROM that requires no more terminals for the program mode than is required for the read mode.

SUMMARY OF THE INVENTION

Accordingly, it is an object of the invention to provide an improved memory output circuit.

It is another object of the invention to provide a memory output circuit that has low power consumption.

It is another object of the invention to provide a memory output circuit that operates in the read mode down to 1.0 volt, thereby permitting direct operation from a one cell battery.

It is another object of the invention to provide a memory output circuit wherein the programming current is extinguished immediately after the memory element changes state.

Still another object of the invention is to provide a memory output circuit that adapts itself to the read or program modes depending upon the voltage applied to the B+ terminal of the memory, thereby requiring no additional terminals to switch the memory between the read and program modes.

Briefly, the invention comprises a low power, low voltage memory output circuit. The output circuit includes at least one memory element in a first programming state. A current sourcing means is connected to the memory element to provide the programming current necessary to program the memory element. To activate the current sourcing means, an activating means is connected to the current sourcing means. To program the memory element, the activating means activates the current sourcing means. When the memory element changes from its first state to a second state, the activating means deactivates the current sourcing means.

In an alternate embodiment, the invention comprises a low power, low voltage memory output circuit. The output circuit includes at least one memory element in a first programming state. A current sourcing means is connected to the memory element to provide the programming current necessary to program the memory element. A sensing means is connected to the memory element to sense the state of the memory element. To activate the current sourcing means, an activating means is connected to the current sourcing means. To program the memory element, the activating means activates the current sourcing means. When the memory element changes from its first state to a second state, the activating means deactivates the current sourcing means.

In still another embodiment, the invention comprises a low power, low voltage memory output circuit for use with a voltage source having first and second voltage ranges. The output circuit includes at least one memory element in a first programming state. A current sourcing means is connected to the memory element to provide the programming current necessary to program the memory element. A sensory means is connected to the memory to sense the state of the memory element. To activate the current sourcing means, an activating means is connected to the current sourcing means. A selecting means is connected to the activating means to select a particular current sourcing means. To program the memory element, the activating means activates the current sourcing means when the voltage source is in the second voltage range. When the memory element changes from its first state to a second state, the activating means deactivates the current sourcing means.

BRIEF DESCRIPTION OF THE DRAWINGS

FIG. 3D is a block diagram of a section of the preferred embodiment of the present invention showing the address decoder.

FIG. 4 is a layout showing the arrangement of FIGS. 3A-3D.

DETAILED DESCRIPTION OF THE PREFERRED EMBODIMENT

Figure 1:
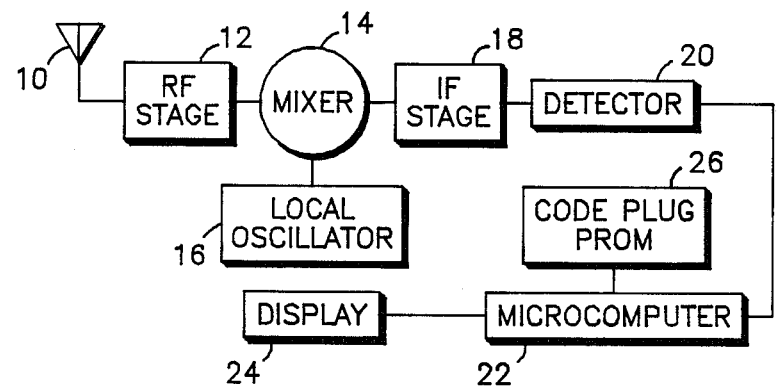
FIG. 1 is a block diagram showing one application of the present invention in a selective call personal paging receiver.

FIG. 1 illustrates one application of the present invention in a selective call personal paging receiver. An antenna 10, an RF stage 12, a mixer 14, a local oscillator 16, an IF stage 18, and a detector 20 are interconnected to form a well known single conversion radio receiver. A binary signal containing an encoded message is modulated on an RF carrier and transmitter to the radio receiver from a base station (not shown). The radio receiver detects the RF carrier and the recovered binary signal appears at the output of detector 20. A microcomputer 22 decodes the message from the recovered binary signal. If the message is addressed to this particular paging receiver, microcomputer 22 sends the message to a display 24 so that it may be viewed by a user.

The majority of the software used by microcomputer 22 is stored in a ROM internal to the microcomputer. Individualized software cannot be stored in the microcomputer's internal ROM, however, because the internal ROM is usually mask programmed, not individually programmed.

Consequently, in one paging system, the software stored in one paging receiver's microcomputer internal ROM may be identical to software stored in another paging receiver's microcomputer internal ROM. Individualized software, however, is important. As for example, selective call paging systems require that each paging receiver have a unique address code in order to selectively alert one paging receiver without alerting other paging receivers in the same system.

To provide for individualized software, a small, inexpensive, individually programmable external memory is connected to microcomputer 22. When utilized in this fashion the external memory is known as a code plug PROM and is illustrated in FIG. 1 by numeral 26.

The information stored in code plug PROM 26 is not limited to an address code, and in fact, within the size limitations of the code plug PROM, any program, code, or data may be stored there. The preferred use for code plug PROM 26, however, is for storing information necessary to individualize, personalize, or customize a particular paging receiver. For example, different options may be activated or inhibited depending upon whether or not certain bits in code plug PROM 26 are set or cleared.

Figure 2:
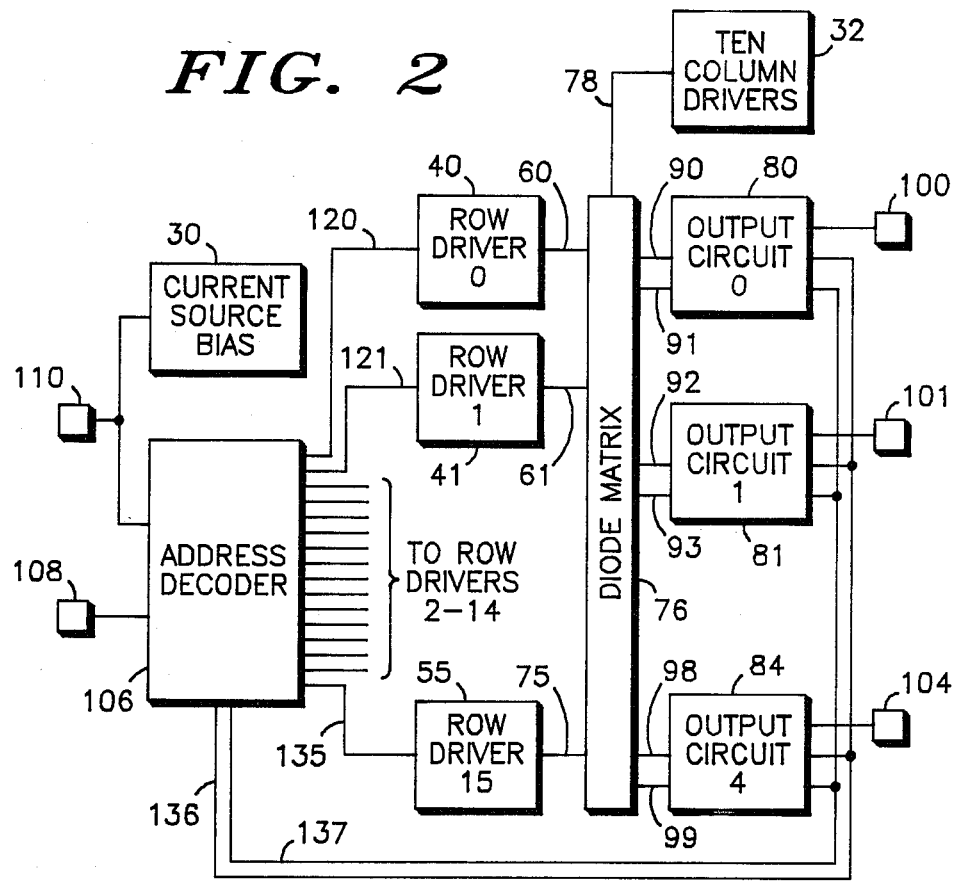
FIG. 2 is a block diagram of the preferred embodiment of the present invention.

FIG. 2 is a block diagram of the preferred embodiment of code plug PROM 26. The preferred embodiment is fabricated with a conventional bipolar integrated circuit process, such as a well known TTL fabrication process with the additional steps, well known in the art, necessary to fabricate Zenar diodes.

A current source bias circuit 30 supplies bias voltage to ten column drivers, collectively designated 32, and to row drivers 0-15. Row drivers 0-15 are designated respectively by reference numerals 40-55, although only row drivers 40, 41, and 55 are illustrated. The output of each row driver 40-55 is connected respectively to one of sixteen row lines 60-75 of a 16×10 diode matrix 76. The output of each of column drivers 32 is connected to one of ten column lines, collectively designated 78.

Each of output circuits 0-4, respectively designated by reference numerals 80-84, has two inputs 90-99 and one output 100-104, for example, output circuit 80 has inputs 90 and 91, and output 100. Not illustrated in FIG.

1 are output circuits 82-83, and their corresponding inputs 94-97 and outputs 102-103. Each of inputs 80-89 is connected to one of ten columns 78 of diode matrix 76. Outputs 100-104 are preferably wire bonding pads.

An address decoder 106 has a clock input 108 and an enable input 110. Enable input 110 is also connected to current source bias circuit 30. Clock input 108 and enable input 110 are preferably wire bonding pads. When enable input 110 is high, both current source bias circuit 30 and address decoder 106 are enabled. Address decoder 106 has sixteen row driver select lines 120-135 which are connected respectively to row drivers 40-55, although only select lines 120, 121, and 135 are labeled. Address decoder 106 also has two output circuit select lines 136 and 137 which are connected to each output circuit 80-84.

Only one row driver select line 120-135 is active at any one time and only one output circuit select line 136 or 137 is active at any one time. When a row driver select line is active, it enables the corresponding row driver circuit 40-55 which in turn activates the corresponding row 60-75 of diode matrix 76. When an output circuit select line 136 or 137 is active it selects one of the two corresponding inputs 90-99 of each output circuit 80-84.

To change the select lines 120-137, a pulse is applied to clock input 108 of address decoder 106. The pulse causes address decoder 106 to shift to the next state and to enable a different combination of one row driver select line 120-135 and one output circuit select line 136 or 137.

It will be understood by those skilled in the art that the preferred embodiment of the present invention is a memory circuit that is externally organized as 32 bytes with 5 bits per byte. Although the preferred embodiment uses sequential addressing it would be obvious to one skilled in the art to substitute random access addressing, or any other method of addressing memories known in the art.

In the read mode a low voltage (typically 1-3 volts) is applied to the power input (not shown in FIG. 2) and to enable input 110. Upon application of power, address decoder 106 is reset to address the first byte of diode matrix 76, whereupon the data stored at this location appears at outputs 100-104. To address the second byte a clock pulse is applied to clock input 108. Successive bytes are addressed by applying additional clock pulses to clock input 108.

Applying a high voltage to the power input places the memory in the program mode. Addressing in the program mode is identical to the read mode. Outputs 100-104, however, function as inputs in the program mode and the data to be programmed is placed on outputs 100-104 (the output is grounded to leave the memory element in the unprogrammed state while the output is floated to change the memory element state).

Figure 3A:
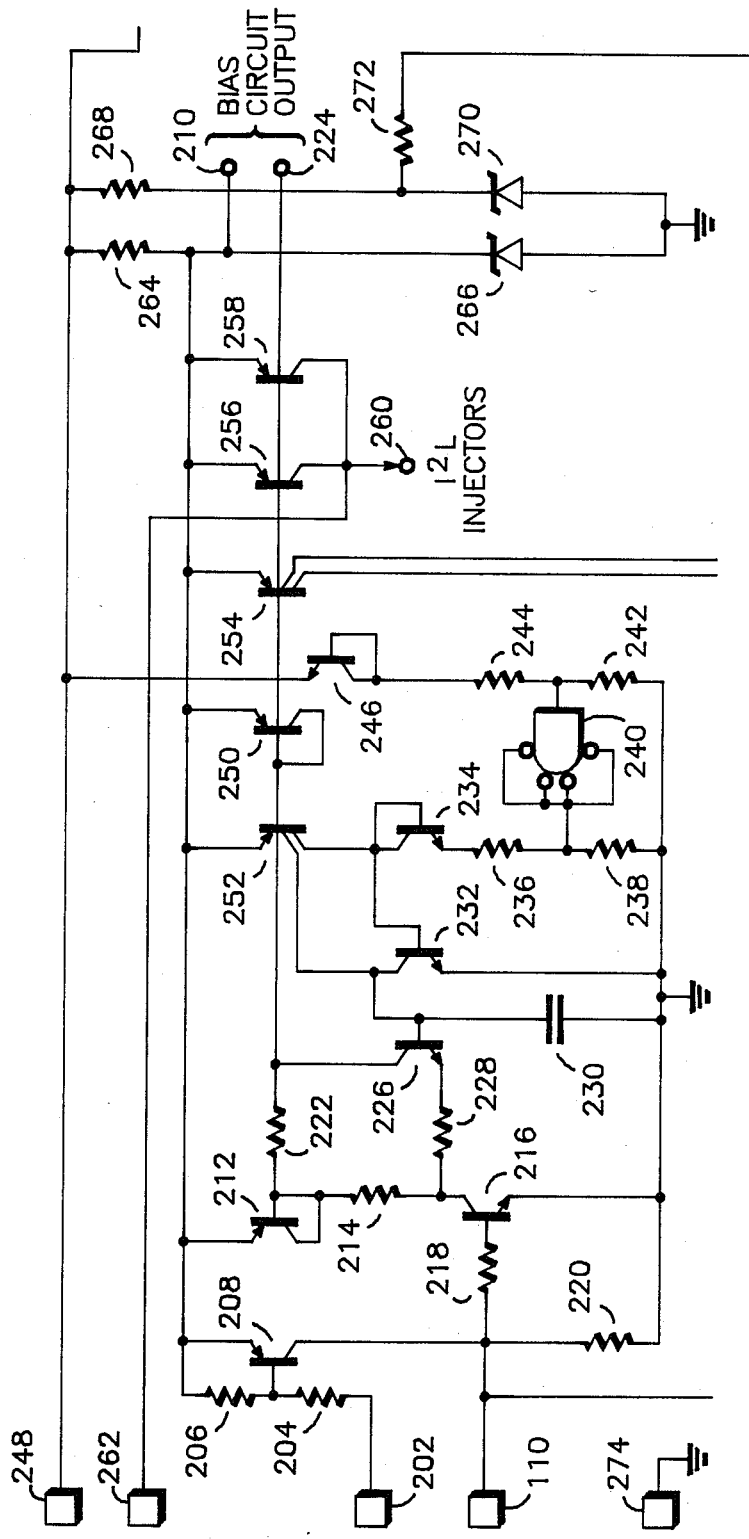
FIG. 3A is a schematic diagram of a section of the preferred embodiment of the present invention showing the bias circuitry.

Referring to FIG. 3A wherein a schematic diagram of the current source bias circuit 30 of FIG. 2 is illustrated. An enable not input terminal 202 is connected to a resistor 204. Resistor 204 has a preferred value of 50 K Ohms. The other end of resistor 204 is connected to the junction of a resistor 206 and the base of a transistor 208. Resistor 206 has a preferred value of 200 K Ohms. The other lead of resistor 206 and the collector of transistor 208 are connected to a source of positive voltage at node 210. The emitter of a PNP transistor 212 is also connected to node 210 while the base and collector of the transistor are connected to a resistor 214. Resistor 214 has a preferred value of 100 K Ohms. The other lead of resistor 214 is connected to the collector of an NPN transistor 216. The emitter of transistor 216 is connected to ground. A resistor 218, having a preferred value of 240 K Ohms, is connected between the base of transistor 216 and enable input terminal 110. A resistor 220, having a preferred value of 200 K Ohms, is connected between enable input 110 and ground. The collector of transistor 208 is also connected to enable input 110. A resistor 222, having a preferred value of 100 K Ohms, is connected between the base collector junction of transistor 212 and node 224. Nodes 210 and 224 form the output port of bias circuit 30.

The collector of an NPN transistor 226 is connected to node 224 while the emitter is connected to a resistor 228. Resistor 228 has a preferred value of 8 K Ohms. The other lead of resistor 228 is connected to the collector of transistor 216. A capacitor 230, having a preferred value of 50 pF, is connected between the base of transistor 226 and ground. The base of transistor 226 is also connected to the collector of an NPN transistor 232. The emitter of transistor 232 is connected to ground while the base is connected to the junction of the collector and base of an NPN transistor 234. The emitter of transistor 234 is connected to a resistor 236. Resistor 236 has a preferred value of 1000 Ohms. The other lead of resistor 236 is connected to a resistor 238. Resistor 238 has a preferred value of 10.5 K Ohms. The other lead of resistor 238 is connected to ground.

The output of a non-injected $I^2L$ inverter 240 is connected to the junction of resistors 236 and 238. The input to inverter 240 is connected to the junction of resistors 242 and 244. Resistors 242 and 244 have a preferred value of 100 K Ohms. The other lead of resistor 242 is connected to ground while the other lead of resistor 244 is connected to the junction of the base and the collector of an NPN transistor 246. The emitter of transistor 246 is connected to a B+ input terminal 248.

The emitter of a PNP transistor 250 is connected to node 210 while the collector and base are connected to node 224. The emitter of a dual collector PNP transistor 252 is connected to node 210, while the base is connected to node 224. The first collector of transistor 252 is connected to the collector of transistor 232 while the second collector is connected to the collector of transistor 234.

The emitter of a dual collector PNP transistor 254 is connected to node 210 while the base is connected to node 224. The emitters of two PNP transistors 256 and 258 are connected to node 210 while the bases are connected to node 224. The collectors of transistors 256 and 258 are connected to $I^2L$ injector node 260 which is also connected to $I^2L$ injector terminal 262.

A resistor 264, having a preferred value of 200 Ohms, is connected between B+ terminal 248 and node 210. The cathode of a Zener diode 266 is connected to node 210 while the anode is connected to ground. The knee voltage of Zener diode 266 is approximately 6.7 volts. A resistor 268, having a preferred value of 200 Ohms, is connected to power input terminal 248. The other lead of resistor 268 is connected to the cathode a Zener diode 270. The anode of Zener diode 270 is connected to ground. Zener diode 270 also has a knee voltage of 6.7 volts. A resistor 272, having a preferred value of 300 Ohms, is connected to the junction of resistor 268 and Zener diode 270. A ground terminal 274 is connected to ground. Terminals 110, 202, 248, 262 and 274 are preferably wire bonding pads.

Figure 3B:
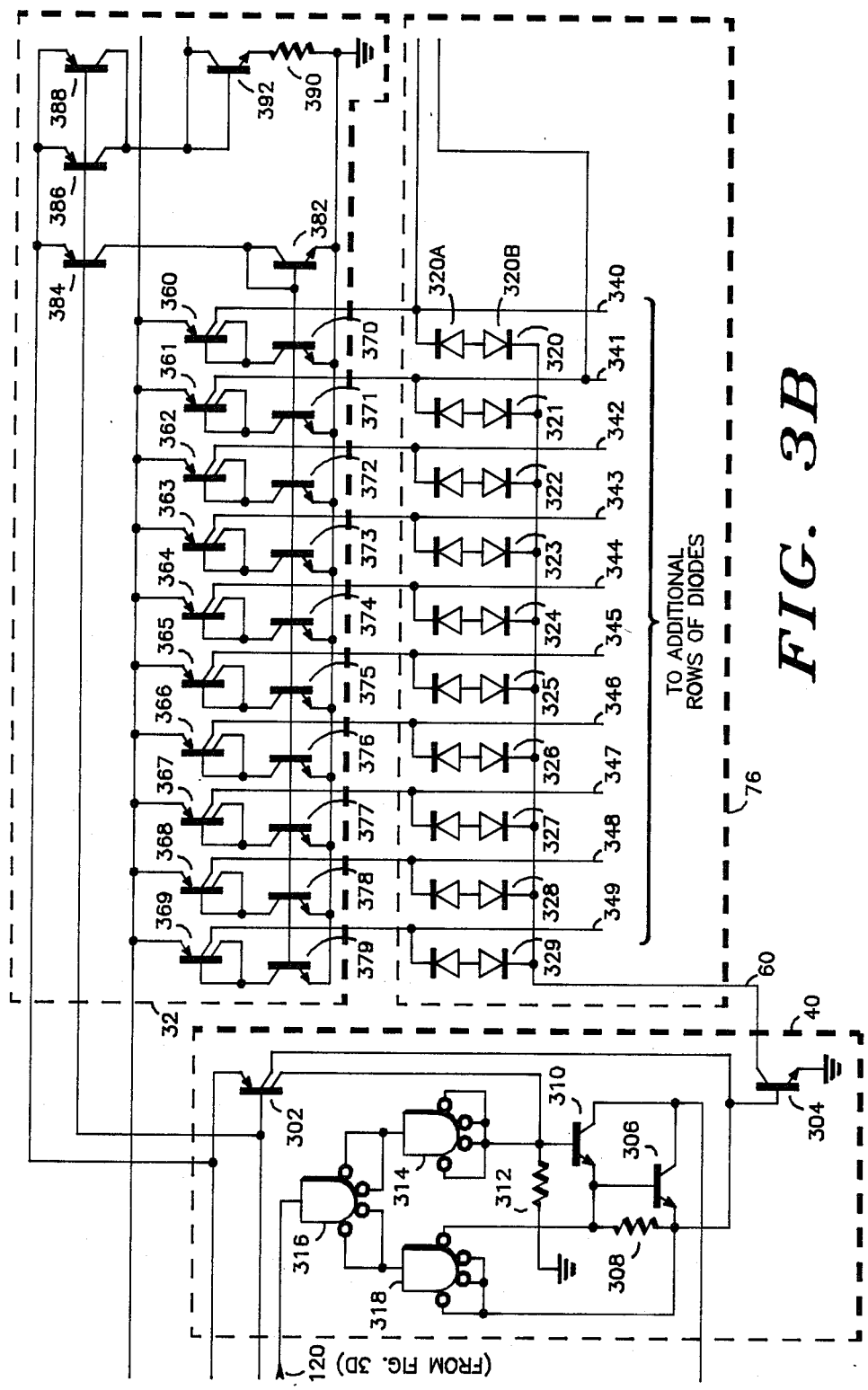
FIG. 3B is a schematic diagram of a section of the preferred embodiment of the present invention showing row and column drivers and a portion of the diode matrix.

Referring to FIG. 3B wherein a schematic diagram of row driver 40, a portion of diode matrix 76, and column drivers 32 of FIG. 2 are illustrated. Although only row driver 40 is illustrated in FIG. 3B, it is typical of the other row drivers 41-55.

The emitter of a dual collector PNP transistor 302 is connected to node 210 of FIG. 3A. The base of transistor 302 is connected to node 224 of FIG. 3A. The first collector of transistor 302 is connected to the base of an NPN transistor 304. The emitter of transistor 304 is connected to ground and the collector is connected to row 60 of diode matrix 76. The base of transistor 304 is also connected to the emitter of an NPN transistor 306. A resistor 308, having a preferred value of 40 K Ohms, is connected between the emitter and base of transistor 306. The collector of transistor 306 is connected to the other lead of resistor 272 of FIG. 3A. The base of transistor 306 is also connected to the emitter of an NPN transistor 310. The collector of transistor 310 is connected to the collector of transistor 306. A resistor 312, having a preferred value of 100 K Ohms, is connected between the base of transistor 310 and ground. The second collector of transistor 302 is connected to the base of transistor 310.

The output of an I²L inverter 314 is connected to the base of transistor 310. I²L inverter 314 is a four collector gate of which all four collectors are connected together. The input to I²L gate 314 is connected to a first output of an I²L inverter 316. The input to I²L inverter 316 is connected to line 120 of FIG. 3D. The second output of I²L inverter 316 is connected to the input of an I₂L inverter 318. I²L inverter 316 is a four collector gate wherein two collectors are connected together to form the first output and the remaining two collectors are connected together to form the second output. The first output of I²L inverter 318 is connected to the base of transistor 306. The second output of I²L inverter 318 is connected to the emitter of transistor 306. I²L inverter 318 is a four collector gate wherein one collector forms the first output and the remaining three collectors are connected together to form the second output. Diode matrix 76 consists of a plurality of diode pairs wherein the diodes of each pair have their anodes mutually connected, for example, diode pair 320. As will be explained in more detail later, each diode pair forms a memory element. In their manufactured or unprogrammed state the diode pairs represent one memory state, for example, a one. To program a particular diode to the opposite state, a high current is passed through a selected diode pair. This high current causes the upper diode, for example 320a, to short. This shorted condition can be sensed by one of output circuits 80-84, and the appropriate high or low state placed on the respective output terminal 100-104.

One cathode of each diode pair 320-329 is connected to row 60. The other cathode of each diode pair 320-329 is connected respectively to one of columns 340-349. Columns 340-349 were generally designated as columns 78 in FIG. 2. In a similar fashion to diode pairs 320-329 additional rows of diode pairs are connected to rows 61-75 (FIG. 2).

The ten column drivers, shown generally by reference numeral 32 of FIG. 2, are also illustrated in more detail in FIG. 3B. The emitters of dual collector PNP transistors 360-369 are connected to B+terminal 248 of FIG. 3A. The first collectors of transistors 360-369 are respectively connected to columns 340-349. The second collectors and bases of transistors 360-369 are respectively connected to the collectors of NPN transistors 370-379. The emitters of transistors 370-379 are connected to ground. Each associated pair of dual collector transistors 360-369 and NPN transistors 370-379 forms a column driver, for example transistors 360 and 370 form a column driver for column 340.

The base and collector of an NPN transistor 382 is connected to all of the bases of transistors 370-379. The emitter of transistor 382 is connected to ground. The emitters and bases of three PNP transistors 384, 386, and 388 are respectively connected to bias circuit output nodes 210 and 224. The collector of transistor 384 is connected to the collector of transistor 382. A resistor 390, having a preferred value of 20K Ohms, connects the emitter of an NPN transistor 392 to ground. The base and emitter of transistor 392 are connected to the collectors of transistors 386 and 388.

Figure 3C:
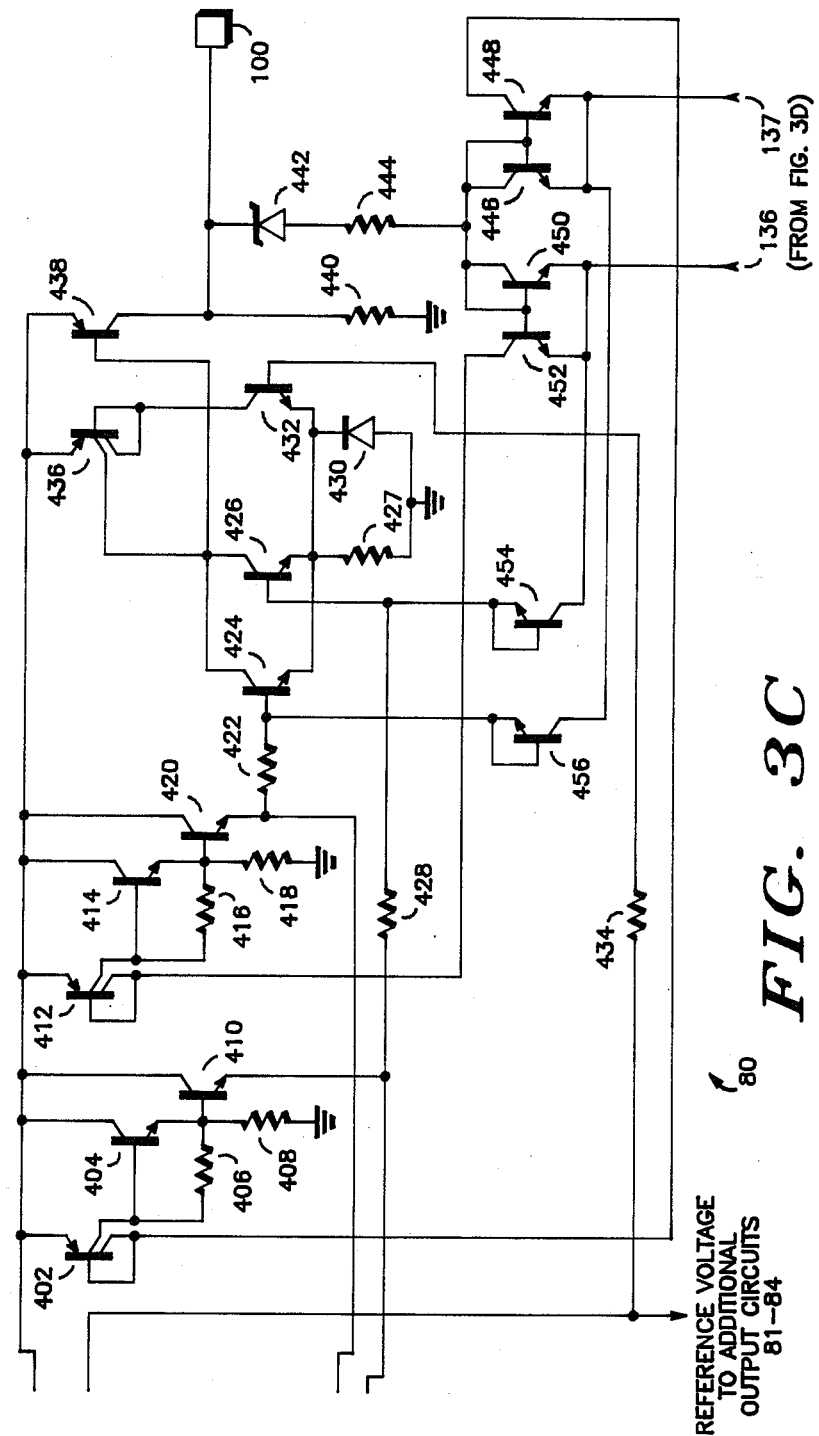
FIG. 3C is a schematic diagram of a section of the preferred embodiment of the present invention showing an output circuit.

Referring to FIG. 3C wherein a schematic diagram of output circuit 80 of FIG. 2 is illustrated. Although only output circuit 80 is illustrated in FIG. 3C, it is typical of other output circuits 81-84.

The emitter of a dual collector PNP transistor 402 is connected to B+terminal 248. The first collector of transistor 402 is connected to the base of an NPN transistor 404. The second collector and base of transistor 402 are mutually connected. A resistor 406, having a preferred value of 50K Ohms, is connected between the emitter and base of transistor 404. The collecto of transistor 404 is connected to B+ terminal 248. A resistor 408, having a preferred value of 30 K Ohms, connects the emitter of transistor 404 to ground. The collector of an NPN transistor 410 is connected to B+ terminal 248. The base of transistor 410 is connected to the emitter of transistor 404. The emitter of transistor 410 is connected to column 341 of diode matrix 76.

The emitter of a dual collector PNP transistor 412 is connected to B+ terminal 164. The first collector of transistor 412 is connected to the base of an NPN transistor 414. The second collector and the base of transistor 412 are mutually connected. The collector of transistor 414 is connected to B+terminal 248. A resistor 416, having a preferred value of 50 K. Ohms, connects the emitter to the base of transistor 414. A resistor 418, having a preferred value of 30 K Ohms, connects the emitter of transistor 414 to ground. The collector of an NPN transistor 420 is connected to B+ terminal 248. The base of transistor 420 is connected to the emitter of transistor 414.

A resistor 422, having a preferred value of 10 K Ohms, connects the base of an NPN transistor 424 to the emitter of transistor 420. The emitter of transistor 420 is also connected to column 340 of diode matrix 76. The collector and emitter of transistor 424 are connected respectively to the collector and emitter of an NPN transistor 426. A resistor 427, having a preferred value of 36.5 K Ohms, connects the emitter of transistor 426 to ground. A resistor 428, having a preferred value of 10 K Ohms, connects the base of transistor 426 to column 341 of diode matrix 76. The cathode of a diode 430 is connected to the emitter of transistor 426 while the anode of diode 430 is connected to ground. The emitter of an NPN transistor 432 is connected to the emitter of transistor 426. A resistor 434, having a preferred value of 10 K Ohms, connects the base of transistor 432 to the collector of transistor 392 of FIG. 3B. The emitter of a dual collector PNP transistor 436 is connected to B+terminal 248. The first collector of transistor 436 is connected to the collector of transistor 426. The second collector and the base of transistor 436 are connected to the collector of transistor 432.

The emitter of a PNP transistor 438 is connected to B+ terminal 248. The base of transistor 438 is connected to the collector of transistor 426. The collector of transistor 438 is connected to output terminal 100. A resistor 440, having a preferred value of 100 K Ohms, connects the collector of transistor 438 to ground.

The cathode of a Zener diode 442, having a knee voltage of approximately 6.7 volts, is connected to output terminal 100. A resistor 444, having a preferred value of 40 K Ohms, connects the anode of Zener diode 442 to the collector and base of an NPN transistor 446. The base and emitter of transistor 446 are connected respectively to the base and emitter of an NPN transistor 448. The collector of transistor 448 is connected to the second collector of transistor 402. The collector of transistor 446 is connected to the collector and base of an NPN transistor 450. The base and emitter of transistor 450 are connected respectively to the base and emitter of an NPN transistor 452. The collector of transistor 452 is connected to the second collector of transistor 412. The emitter of transistor 452 is connected to the collector of an NPN transistor 454. The base and emitter of transistor 454 are connected to the base of transistor 426. The emitter of transistor 446 is connected to the collector of NPN transistor 456. The base and emitter of transistor 456 are connected to the base of transistor 424.

Referring to FIG. 3D wherein a diagram of address decoder 106 of FIG. 2 is illustrated. A clock input terminal 502, preferably a wire bonding pad, is connected to the clock input of a well-known five bit binary counter 504. Outputs Q0–Q3 are connected respectively to inputs D0–D3 of a well-known four to sixteen line decoder 506. Outputs Q0–Q15 of decoder 506 are connected respectively to the input of row drivers 40–55. Output Q4 of binary counter 504 is connected to the input of an inverter 508. The output of inverter 508 is connected to the base of an NPN transistor 510. The emitter of transistor 510 is connected to ground while the collector is connected to the emitter of transistor 450 of FIG. 3C. Output Q4 of binary counter 504 is connected to the base of an NPN transister 512. The emitter of transistor 512 is connected to ground while the collecter is connected to the emitter of transistor 446 of FIG. 3C. The base of transistor 512 is connected to the first collector of transistor 254 of FIG. 3A. The base of transistor 510 is connected to the collector of transistor 254 of FIG. 3A.

Binary counter 504, decoder 506 and inverter 508 are constructed from well-known I²L technology. An enable input on binary counter 504 is connected to enable terminal 110 of FIG. 3A. Binary counter 504 is designed to reset to the all zeros state at outputs Q0–Q4 upon power up.

The present invention has two operating modes, read and program. Switching between the modes is accomplished by changing the power supply voltage at B+ terminal 248, 1–3 volts for read and 9–12 volts for program.

The voltage developed across nodes 210 and 224 is the bias circuit output voltage. In the read mode, a predetermined first or read mode bias voltage is developed at the bias circuit output, while in the program mode, a larger predetermined second or program mode bias voltage is developed. Bias circuit 30 has a means to sense the range of the power supply voltage at B+ terminal 248 and to switch the bias voltage output accordingly. When B+ terminal 248 is in the first or read mode voltage range, the bias circuit output is at the read mode bias voltage. Conversely, when B+ terminal 248 is in the second or program mode voltage range, the bias circuit output is at the larger program mode bias voltage.

PNP current sources, such as transistors 254, 256, and 258, are connected to the bias circuit output by respectively connecting the emitters and bases of such transistors to nodes 210 and 224. Any reasonable number of such PNP transistors can be connected to the bias circuit output and the collectors of such transistors will all source equal amounts of current, provided, of course, that the geometries of the transistors are identical. By varying the geometries of such PNP transistors, however, one such PNP transistor can be designed to source any multiple of the current sourced by a second such PNP transistor.

In the read mode, 1–3 volts is applied to B+ terminal 248. B+ voltage is connected to node 210 through resistor 264. Because Zener diode 266 has a knee voltage of approximately 6.7 volts and the read mode voltage is typically limited to 3 volts maximum, zero diode 266 is nonfunctional in the read mode.

Transistors 208 and 216, and resistors 204, 206, 218, and 220 function to enable and disable bias circuit 30. Bias circuit 30 is enabled when enable terminal 110 is high or enable not terminal 202 is low, however, enable terminal 110 and enable not terminal 202 should never both be low. When enable terminal 110 is high, current is sourced through resistor 218 and the base-emitter circuit of transistor 216, thereby saturating transistor 216, pulling its collector to ground, and activating bias circuit 30. In a similar fashion, if enable not terminal 202 is low, current flows through resistor 204 and the base-emitter circuit of transistor 208, thereby saturating transistor 208 and pulling its collector up substantially to the potential at node 210. Current is then sourced by transistor 208 to resistor 218 and the base-emitter circuit of transistor 216, thereby saturating transistor 216, pulling its collector to ground, and activating bias circuit 30.

To disable bias circuit 30 either enable terminal 110 must be low, or enable terminal 110 must be in a high impedance state and enable not terminal 202 pulled high. Under either of these conditions, no current flows through the base-emitter circuit of transistor 216, thereby leaving transistor 216 off and bias circuit 30 disabled.

Transistor 246 functions as a Zener diode with a knee voltage of approximately 6.7 volts. In the read mode, with a maximum of 3.0 volts applied to B+ terminal 248, Zener diode 246 is essentially open circuited. Consequently, no current flows through resistor 244 and the input of non-injected I²L gate 240. With no input current, the output of I²L gate 240 is in the high impedance state. Thus, in the read mode, Zener diode 246, resistors 242 and 244, and I²L gate 240 are essentially out of the circuit.

The heart of bias circuit 30 is a feedback circuit comprised of transistors 226, 232, 234, 250, and 252, resistors 228, 236, and 238, and capacitor 230. When bias circuit 30 is enabled, the collector of transistor 216 can be considered to be at ground potential. It should be noted that transistors 234 and 250 are interconnected as diodes and will be referred to as such. The feedback circuit can be visualized as two interconnected current mirror circuits, the first current mirror circuit comprising diode 250 and transistor 252, and the second circuit comprising diode 234 and transistor 232. When transistor 226 is biased on, the current sourced by both collectors of transistor 252 will be proportional to the current flowing through diode 250 and the collector of transistor 226. Because both collectors of transistor 252 have equal geometries, they source substantially the same amount of current. In the second current mirror circuit, the current flowing through diode 234 will be proportional to the collector current of transistor 232. The proportionality, however, will depend upon the total resistance from the cathode (emitter) of diode 234 to ground. The higher this resistance, the greater the collector current of transistor 232 is in relation to the current through diode 234.

At the quiescent point in the read mode, approximately 3 microamps flows from each collector of transistor 252. Some of the current from the second collector of transistor 252 flows through diode 234 and resistors 236 and 238, while the remainder flows through the base-emitter circuit of transistor 232. In a similar fashion some of the current sourced by the first collector of transistor 252 flows through the collector circuit of transistor 232 while the remainder flows through the base emitter circuit of transistor 226. Transistor 226 pulls down on the base of transistor 252 thereby maintaining the base to emitter voltage at a constant read mode quiescent voltage. Since this base to emitter voltage is substantially constant, if another PNP transistor, such as transistor 254, is similarly connected, and if such other PNP transistor has similar geometries as transistor 252, then this additional transistor will also source substantially the same amount of collector current as the collectors of transistor 252.

If we momentarily displace the base to emitter voltage of transistor 252, it can readily be seen that the feedback circuit has a stable quiescent point. When the base to emitter voltage of transistor 252 increases (i.e. the base to ground voltage drops), so does the collector currents of the transistor. When the current sourced by the second collector of transistor 252 increases, the base current of transistor 232 also increases, thereby increasing the collector current of transistor 232. When the collector current of transistor 232 increases, it "steals" more of the current being sourced from the first collector of transistor 252, thereby reducing the base current of transistor 226. When the base current of transistor 226 decreases, so does its collector current. With a reduced collector current, transistor 226 "pulls" less on the base of transistor 252, thereby permitting the base voltage to rise (i.e. the base to emitter voltage to drop). Thus, the base to emitter voltage of transistor 252 returns to its quiescent point.

In a like manner, if the base-emitter voltage of transistor 252 drops, (i.e. the base voltage rises), less current flows from the second collector of transistor 252 and less current flows through the base of transistor 232. With less base current the collector of transistor 232 sinks less current from the second collector of transistor 252 and consequently, more current flows through the base of transistor 226. With more base current the collector current of transistor 226 increases, thereby pulling down on the base of transistor 252, and increasing its base to emitter voltage, returning the feedback circuit to its quiescent point.

In the program mode, approximately 10 volts is applied to B+ terminal 248. Because Zener diode 246 has a knee voltage of only 6.7 volts, it conducts, and current flows through resistors 242 and 244, as well as the input of non-injected I$^2$L gate 240. Therefore, I$^2$L gate 240 switches on, thereby causing its output to go substantially to ground and effectively shorting out resistor 238.

As previously discussed, the ratio of the collector current of transistor 232 to diode 234 current is a function of the total resistance from the cathode of diode 234 to ground. The higher this resistance, the greater the collector current of transistor 232 is in relation to the current through diode 234. Thus, when I$^2$L gate 240 shorts out resistor 238, the total resistance between the cathode of diode 234 to ground is reduced. Therefore, the collector current of transistor 232 goes down. When the collector current of transistor 232 decreases, more current being sourced by the first collector of transistor 252 is diverted to the base of transistor 226, causing the collector current of transistor 226 to increase, thereby pulling the base voltage of transistor 252 down, (i.e. increasing the base to emitter voltage of transistor 252). This continues until the base to emitter voltage stabilizes at the program mode quiescent point.

The program mode base to emitter voltage of transistor 252 is greater than the read mode base to emitter voltage and therefore the collectors of transistor 252 source more current than in the read mode. The program mode collector current of transistor 252 is about 30 micro amps. As in the read mode, PNP transistors having identical geometries and similarly connected across the base to emitter circuit of transistor 252 will source substantially the same amount of collector current as the collectors of transistor 252.

Referring to typical row driver 40 of FIG. 3B, I$^2$L gates 314, 316, and 318 provide a means for selectively activating the row driver. To select row driver 40, output 120 of address decoder 106 and the input to I$^2$L gate 316 go high. This causes the inputs to I$^2$L gates 314 and 318 to go low and their outputs to go into the high impedance state. Consequently, transistors 304, 306, and 310 are uninhibited and row driver 40 is selected.

When address decoder 106 selects a row driver other than row driver 40, the input to I$^2$L gate 316 goes low, causing the inputs to I$^2$L gates 314 and 318 to go high and the bases of transistors 304, 306, and 310 to be pulled substantially to ground. Consequently, transistors 304, 306, and 310 are inhibited and row driver 40 is deselected.

Transistor 304 provides a means for enabling the flow of current through memory elements 320-329. In particular, current is sourced by column drivers 32 to columns 340-349. If one or more diode pairs 320-349 is shorted, the current flows through that shorted diode pair to row 60, and then through the collector-emitter path of transistor 304 to ground.

A controlling means, comprised of transistors 302, 306, and 310 and resistors 308 and 312, controls the current sinking capability of transistor 304. Transistor 302 is connected to the bias circuit output and when the bias circuit output is at the read mode bias voltage, transistor 304 has a first predetermined current sinking capability. When the bias circuit output is at the program mode bias voltage, transistor 304 has a much larger second predetermined current sinking capability.

In the read mode, the first collector of transistor 302 sources a small bias current to the base of transistor 304. The second collector of transistor 302 attempts to source current to the base of transistor 304 through darlington connected transistors 306 and 310, however, because of the low current utilized in the read mode, the voltage at the base of transistor 310, which is generated by the current flowing through resistor 312 is insufficient to overcome the diode voltage drops presented by the series connection of the base emitter junctions of transistors 304, 306, and 310. Therefore, darlington connected transistors 306 and 310 are biased off and provide no additional bias current to the base of transistor 304. Consequently, in the read mode, only the first collector of transistor 302 supplies significant base current to transistor 304 and transistor 304 has a first or read mode maximum current sinking capability.

In the program mode, the bias output voltage increases and the collectors of transistor 302 are capable of sourcing an additional amount of current. The second collector of transistor 302 now sources sufficient current to turn on darlington connected transistors 306 and 310 and they in turn source an even larger amount of bias current to the base of transistor 304. Therefore, in the program mode the total current into the base of transistor 304 is substantially larger than in the read mode. Consequently, in the program mode transistor 304 has a second or program mode current sinking capability which is much greater than the read mode current sinking capability.

Figure 5:
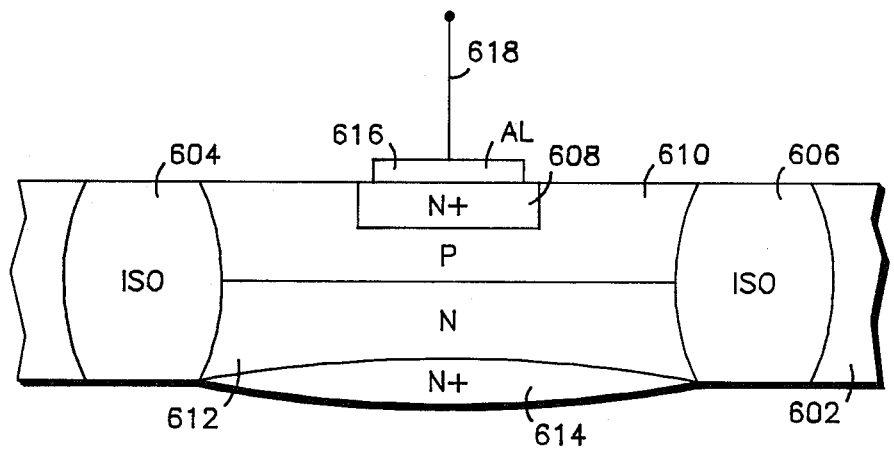
FIG. 5 is a cross section of an integrated circuit showing the construction of a typical diode pair.

A detail of a typical diode pair of diode matrix 76, for example diode pair 320 of FIG. 3B, is illustrated in FIG. 5. Substrate 602 has isolation regions 604 and 606. An N+ region 608 and a P region 610 form respectively the cathode and anode of upper diode 320a of FIG. 3B. An N region 612 and an N+ region 614 form respectively the anode and cathode of lower diode 320b of FIG. 3B. An aluminium deposit 616 attaches wire bond 618 to N+ region 608.

Because the diodes are connected anode to anode, substantially no current can flow through an unprogrammed diode pair in the read mode. In the program mode, however, sufficient voltage is present to cause the upper diode, formed by regions 608 and 610 to Zener, thereby conducting current through the diode pair. In the program mode this current is sufficiently strong to cause aluminum deposit 616 to diffuse across the junction of regions 608 and 610, thereby shorting out upper diode 320a of FIG. 3B.

Referring to FIG. 3B, transistors 360 and 370 are interconnected to form a typical column driver. The collector of transistor 384 sources current to diode connected transistor 382. Diode 382 and transistor 370 are interconnected as a current mirror circuit and the collector of transistor 370 sinks current from the second collector of dual collector transistor 360 in proportion to the current through diode 382. Since the collectors of dual collector transistor 360 have equal geometries, the first collector sources an amount of current to column 340 equal to the current sourced by the second collector.

To read the state of typical diode pair 320, row line 60 is first pulled to ground by selecting row driver 40. If diode pair 320 is in the open or unprogrammed state, the column driver circuit, comprised of transistors 360 and 370, pulls up column 340 substantially to B+. If the diode pair is in the shorted or programmed state, current sourced from the column driver circuit passes through shorted upper diode 320a, forward biased lower diode 320b, and through current enabling transistor 304 to ground. In the programmed state, therefore, the voltage that appears on column 340 is substantially a diode drop above ground. The voltage on column 340, whether low or high, can then be sensed by output circuit 80 and the appropriate state outputted to terminal 100.

Transistors 386, 388, and 392, and resistor 390 form a reference voltage source. The collectors of transistors 386 and 388 source current to diode connected transistor 392 and resistor 390. Diode 392 is forward biased and a reference voltage is developed at the anode (collector) of diode 392.

Referring to FIG. 3C wherein a schematic diagram of typical output circuit 80 is illustrated. Transistors 424, 426, 432, 436 and 438, resistors 427 and 440, and diode 430 form a differential amplifier with dual non-inverting inputs. The differential amplifier is a memory sensing means for sensing the state of the memory elements, i.e. diode pairs 320–329. The base of transistor 424 is the first non-inverting input, the base of transistor 426 is the second non-inverting input, and the base of transistor 432 is the inverting input. Output terminal 100 is the output of the differential amplifier.

The first non-inverting input to the differential amplifier is connected through resistor 422 to column 340 of diode matrix 76, and the second noninverting input is connected through resistor 428 to column 341. The inverting input is connected through resistor 434 to the reference voltage source at the anode (collector) of diode 392. Diode connected transistors 454 and 456 provide a means for selecting one of the non-inverting inputs of the differential amplifier.

To read the state of typical diode pair 320, recall that if row 60 has been selected, the voltage on column 340 will be high if the diode pair is unprogrammed (open), and low if the diode pair has been programmed (shorted). First, address decoder 106 selects the first non-inverting input of the differential amplifier by pulling the cathode (collector) of transistor 454 to ground, thereby disabling the second non-inverting input. If diode pair 320 is unprogrammed, the voltage on column 340 and at the first non-inverting input of the differential amplifier will be high. This voltage exceeds the reference voltage at the inverting input of the differential amplifier and output terminal 100 goes high. If diode pair 320 is programmed, the voltage on column 340 and at the first non-inverting input of the differential amplifier will be low. This voltage is less than the reference voltage at the inverting input and output terminal 100 goes low.

Transistors 412, 414, and 420, and resistors 416 and 418 comprise a first program current source and transistors 402, 404, and 410, and resistors 406 and 408 comprise a second program current source. The first and second program current sources are connected respectively to columns 340 and 341. Zener diode 442, resistor 444, transistor 452, and diode connected transistor 450 provide a means for activating the first program current source, while Zener diode 442, resistor 444, transistor 448, and diode connected transistor 446 provides a means for activating the second program current source. A means for selecting the first or second program current sources is provided by grounding respectively the emitter of transistor 452 or 448.

To program typical diode pair 320, row 60 is selected, 10 volts is applied to B+ terminal 248 and the address decoder selects the first program current source by pulling the emitter of transistor 452 and the cathode of diode 450 to ground. Since diode pair 320 must initially be in the unprogrammed or open state, a high voltage is present on column 340. As in the read mode, the differential amplifier senses this high voltage and pulls output terminal 100 high. Because B+ terminal 248 is at 10 volts, a high at output terminal 100 is also at 10 volts. This voltage exceeds the knee voltage of Zener diode 442 and it conducts, sourcing current into the anode (collector) of diode 450. This current is mirrored by the collector of transistor 452, which in turn activates transistor 412 by sinking current from the second collector of transistor 412. Transistor 412 now sources current from its first collector to darlington connected transistors 414 and 420, causing a large current to be sourced to diode pair 320.

As previously described, this large current causes upper diode 320a to short, thereby bringing column line 340 low. The low voltage on column line 340 is sensed by the differential amplifier, and output terminal 100 goes low. Consequently, Zener diode 442 is no longer forward biased, cutting off the current to diode 450 and transistor 452, thereby switching off the program current source.

Thus, the present invention is self extinguishing in the program mode. As soon as upper diode 320a shorts, the programming current is stopped. This prevents further destructive diffusion of aluminum deposit 616 (FIG. 5) into the lower diode 320b.

I claim:

1. A self extinguishing programmable memory circuit having selectable read and program modes, comprising in combination:
    at least one memory element having programmable first and second states;
    current sourcing means, coupled to said memory element, for sourcing a programming current to said memory element;
    comparator means, coupled to said memory element, for providing first and second output voltages corresponding respectively to said first and second programmable states of said memory element; and
    activating means, coupled between said current sourcing means and said comparator means, for activating said current sourcing means in said program mode when the output of said comparator means is at said first voltage, and for deactivating said current sourcing means when said memeory element changes states and the output of said comparator means changes to said second voltage.

2. The memory circuit of claim 1, wherein said activating means includes a Zener diode, a transistor, and a second diode, said second diode being coupled between the base and emitter of said transistor, the collector of said transistor being coupled to said current sourcing means, and said Zener diode being coupled between said comparator means and the base of said transistor.

3. The memory circuit of claim 1, further comprising a column driver circuit coupled to said memory element and a power input terminal coupled to said column driver circuit, whereby the selection of one of said read and program modes is exclusively determined by the voltage at said power input terminal.

4. The memory circuit of claim 3, wherein said activating means includes a Zener diode, a transistor and second diode, said second diode being coupled between the base and emitter of said transitor, the collector of said transistor being coupled to said current sourcing means, and said Zener diode being coupled between said comparator means and the base of said transistor.

5. The memory circuit of claim 3, wherein said current sourcing means includes a dual collector transistor having first and second collectors and a second transistor, said first collector being coupled to the base of said second transistor, said second collector and the base of said dual collector transistor being coupled to said activating means, the emitter of said second transistor being coupled to said memory element, and the emitter of said dual collector transistor being coupled to the collector of said second transistor.

6. The memory circuit of claim 1, wherein said current sourcing means includes a dual collector transistor having first and second collectors and a second transistor, said first collector being coupled to the base of said second transistor, said second collector and the base of said dual collector transistor being coupled to said activating means, the emitter of said second transistor being coupled to said memory element, and the emitter of said dual collector transistor being coupled to the collector of said second transistor.

7. The memory circuit of claim 6, wherein said activating means includes a Zener diode, a third transistor, and a second diode, said second diode being coupled between the base and the emitter of said third transistor, the collector of said third transistor being coupled to said second collector of said dual collector transistor, and said Zener diode being coupled between said comparator means and the base of said third transistor.

8. The memory circuit of claim 1, further including a power input terminal coupled to said comparator means, whereby the selection of one of said read and program modes depends exclusively upon the voltage at said power input terminal.

9. The memory circuit of claim 8, wherein said current sourcing means includes a dual collector transistor having first and second collectors and a second transistor, said first collector being coupled to the base of said second transistor, said second collector and the base of said dual collector transistor being coupled to said activating means, the emitter of said second transistor being coupled to said memory element, and the emitter of said dual collector transistor being coupled to the collector of said second transistor.

10. The memory circuit of claim 8, wherein said activating means includes a Zener diode, a transistor, and a second diode, said second diode being coupled between the base and emitter of said transistor, the collector of said transistor being coupled to said current sourcing means, and said Zener diode being coupled between said comparator means and the base of said transistor.

11. A self extinguishing programmable memory circuit having selectable read and program modes, comprising in combination:
    at least one memory element having programmable first and second states;
    current sourcing means, coupled to said memory element, for sourcing a programming current to said memory element;
    comparator means, coupled to said memory element, for providing first and second output voltages corresponding respectively to said first and second programmable states of said memory element;
    a power input terminal coupled to said comparator means;
    activating means, coupled to said current sourcing means, for activating said current sourcing means in said program mode when the output of said comparator means is at said first voltage, and for deactivating said current sourcing means when said memory element changes states and the output of said comparator means changes to said second voltage; and selecting means, connected to said activating means, for selecting said current sourcing means;

whereby, the selection of one of said read and program modes is exclusively determined by the voltage at said power input terminal.

12. The memory circuit of claim 11, wherein said current sourcing means includes a dual collector transistor having first and second collectors and a second transistor, said first collector being coupled to the base of said second transistor, said second collector and the base of said dual collector transistor being coupled to said activating means, the emitter of said second transistor being coupled to said memory element, and the emitter of said dual collector transistor being coupled to the collector of said second transistor.

13. The memory circuit of claim 11, wherein said comparator means includes a dual non-inverting input differential amplifier having one of said non-inverting inputs coupled to said memory element.

14. The memory circuit of claim 11, wherein said activating means includes a Zener diode, a transistor, and a second diode, said second diode being coupled between the base and emitter of said transistor, the collector of said transistor being coupled to said current sourcing means, and said Zener diode being coupled between said comparator means and the base of said transistor.

* * * * *